United States Patent [19]
Pantelakis et al.

[11] Patent Number: 5,532,915
[45] Date of Patent: Jul. 2, 1996

[54] METHOD AND APPARATUS FOR PROVIDING AN ULTRA LOW POWER REGULATED NEGATIVE CHARGE PUMP

[75] Inventors: Dimitris Pantelakis, Folsom; Kerry Tedrow, Orangevale; Johnny Javanifard, Sacramento; George Canepa, Folsom, all of Calif.

[73] Assignee: Intel Corporation, Santa Clara, Calif.

[21] Appl. No.: 217,095

[22] Filed: Mar. 23, 1994

[51] Int. Cl.[6] .............................. H02M 3/18; G05F 3/16
[52] U.S. Cl. .............................................. 363/60; 327/536
[58] Field of Search ..................... 363/59, 60; 327/530, 327/534, 535, 536, 544; 365/226, 227, 228

[56] References Cited

U.S. PATENT DOCUMENTS

| | | | |
|---|---|---|---|
| 4,638,464 | 1/1987 | Cranford, Jr. et al. | 363/59 |
| 5,168,174 | 12/1992 | Naso et al. | 307/296.6 |
| 5,216,588 | 6/1993 | Bajwa et al. | 363/60 |
| 5,337,284 | 8/1994 | Cordoba et al. | 365/227 |
| 5,355,356 | 10/1994 | Johann et al. | 369/59 |
| 5,392,205 | 2/1995 | Zavaleta | 363/59 |
| 5,394,027 | 2/1995 | Park | 327/536 |
| 5,397,928 | 3/1995 | Chan et al. | 363/60 |
| 5,410,465 | 4/1995 | Tan | 363/60 |
| 5,414,669 | 5/1995 | Tedrow et al. | 365/226 |
| 5,422,586 | 6/1995 | Tedrow et al. | 327/306 |
| 5,422,600 | 6/1995 | Petty et al. | 330/257 |

OTHER PUBLICATIONS

Miyawaki et al., "A New Erasing and Row Decoding Scheme for Low Supply Voltage Operation 16–Mb/64–Mb Flash Memories," IEEE Journal of Solid State Circuits, vol. 27, No. 4, Apr. 1992 pp. 583–587.

Umezawa et al, "A 5–V–Only Operation 0.6–um. Flash EEPROM with Row Decoder Scheme in Triple–Well Structure," IEEE Journal of Solid–State Circuits, vol. 27, No. 11, Nov. 1992 pp. 1540–1545.

Jinbo et al., "A 5–V–Only 16–Mb Flash Memory with Sector Erase Mode", IEEE Journal of Solid State Circuits, vol. 27, No. 11, Nov. 1992, pp. 1547–1553.

*Primary Examiner*—Matthew V. Nguyen
*Attorney, Agent, or Firm*—Blakely, Sokoloff, Taylor & Zafman

[57] ABSTRACT

A circuit for providing a regulated output voltage from a charge pump circuit while utilizing very low amounts of power, the circuit including a clock circuit for providing clock pulses to operate the charge pump circuit to produce an output voltage, a bias circuit for monitoring the output voltage of the charge pump and furnishing signals for enabling the clock circuit in response to an insufficient output voltage, and circuitry for enabling the bias circuit during a fraction of the total operating time available to the charge pump.

19 Claims, 4 Drawing Sheets

METHOD AND APPARATUS FOR PROVIDING AN ULTRA LOW POWER REGULATED NEGATIVE CHARGE PUMP

BACKGROUND OF THE INVENTION

1. Field of the Invention

This invention relates to computer systems, and more particularly, to methods and apparatus for providing a precise regulated voltage from a charge pump while expending an extremely low amount of power.

2. History of the Prior Art

There has been a recent trend toward lowering the power requirements of portable computers. In order to reduce power consumption, much of the integrated circuitry used in personal computers is being redesigned to run at low voltage levels. The circuitry and components used in portable computers are being designed to operate at voltage levels such as 5 volts and 3.3 volts. This helps a great deal to reduce the power needs of such computers.

However, some of the features of portable computers require voltages higher than these supply voltages. For example, flash electrically-erasable programmable read only memory (flash EEPROM memory) has begun to be used as a new form of long term random access storage. An example of a flash EEPROM memory array which may be used in place of a hard disk drive is described in U.S. patent application Ser. No. 07/969,131, entitled *A Method and Circuitry For A Solid State Memory Disk*, S. Wells, filed Oct. 31, 1992, and assigned to the assignee of the present invention. Such an array provides a smaller lighter functional equivalent of a hard disk drive which operates more rapidly and is not as sensitive to physical damage. Such memory arrays are especially useful in portable computers where space is at a premium and weight is important. These flash EEPROM memory arrays, however, require much higher voltages and substantially more power for programming and erasing data than can be provided directly by the batteries of low powered portable computers.

Charge pumps may be used in portable computers to provide a high voltage from a lower voltage source. However, one problem with using charge pumps is that the voltage level provided at an output terminal tends to vary substantially from a desired value. The output of a charge pump is furnished in a series of charge pulses which are stored to provide a source voltage. The charge pump generates this form of output because the output stage functions in the manner of a diode which only transfers charge to the output in a properly biased condition. This creates a voltage ripple on the output of the pump when the current requirements are high relative to the capacitance of the load. Moreover, the output voltage will vary for different source voltages, temperatures, manufacturing processes, and load currents. On the other hand, it is necessary to provide very accurate voltages for programming and erasing the cells of a flash EEPROM memory array. This problem makes it desirable to attempt to regulate the output voltage provided by charge pumps to obtain a relatively constant value over ranges of source voltages, temperatures, and manufacturing processes.

Another way in which the power requirements of the flash EEPROM arrays have been reduced is through the use of negative gate erase techniques. These techniques reduce the amount of current required during the erase of the flash EEPROM memory array and thereby reduce the power used. Consequently, it is especially desirable to regulate the output voltage provided by charge pumps utilized to generate voltages used for negative gate erase operations.

One voltage necessary for use with flash EEPROM memory arrays is a negative voltage which is used at the gate terminal of a P channel isolation transistor which is part of the word decoder in such memory arrays. Such a transistor must be operated with very little delay once an operation is commenced. For this reason, the negative voltage used must be immediately available. Providing art immediately available voltage from a charge pump normally requires that the charge pump be on at all times. This, in itself, usually requires the expenditure of substantial power. It is, therefore, desirable to provide an ultra-low power negative charge pump circuit which may remain operative while expending very little power.

SUMMARY OF THE INVENTION

It is, therefore, an object of the present invention to provide a very simple method and apparatus for providing a regulated output voltage from a charge pump while expending minimal power.

It is another, more specific, object of the present invention to provide a method and apparatus for providing a regulated output voltage from a negative charge pump with the expenditure of minimal power which voltage may be used to operate a wordline isolation transistor in a memory array.

These and other objects of the present invention are realized in a circuit which includes a charge pump adapted to produce a negative output voltage which may be used to drive gate isolation transistors in a flash EEPROM memory array, a source of clock pulses for causing the charge pump to generate a negative output voltage, circuitry for enabling the clock circuitry during a small fraction of the operating time of the computer with which the circuit is associated, and current mirroring circuitry for regulating the source of clock pulses whereby the output voltage from the charge pump is maintained at a relatively constant level during the period in which clock pulses are generated.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
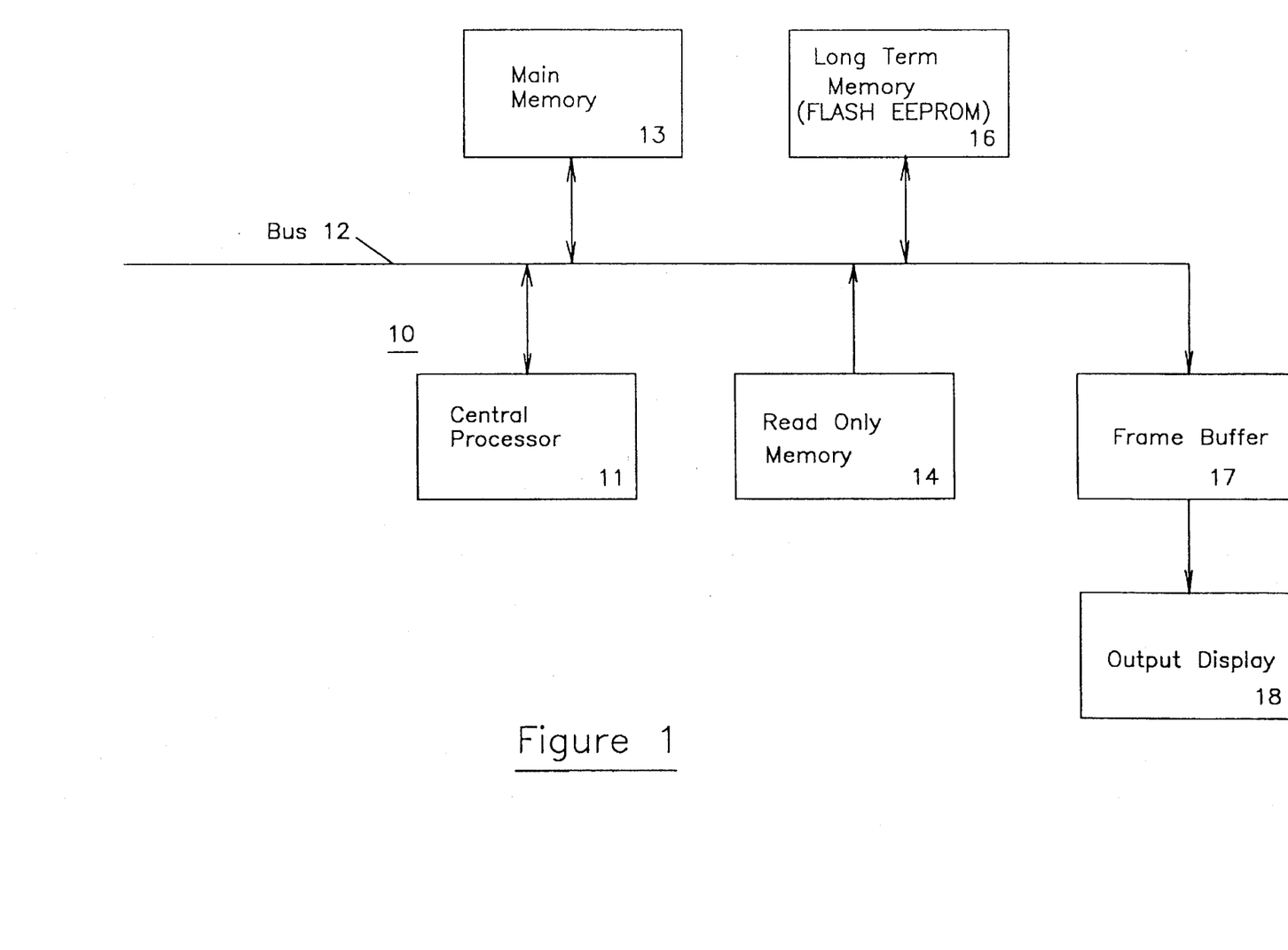
FIG. 1 is a block diagram of a computer system the elements of which may combine to provide the present invention.

Referring now to FIG. 1, there is illustrated a computer system 10. The system 10 includes a central processing unit 11 which executes the various instructions provided to the computer system 10 to control its operations. The central processing unit 11 is joined to a bus 12 adapted to carry information to various components of the system 10. Joined to the bus 12 is main memory 13 which is typically constructed of dynamic random access memory arranged in a manner well known to those skilled in the art to store information during a period in which power is provided to the system 10. Also joined to the bus 12 is read only memory 14 which may include various memory devices well known to those skilled in the art each of which is adapted to retain a particular memory condition in the absence of power to the system 10. The read only memory 14 typically stores various basic functions used by the processor 11 such as basic input/output processes and startup processes typically referred to as BIOS processes.

Also connected to the bus 12 are various peripheral components such as long term memory 16 and circuitry such as a frame buffer 17 to which data may be written which is to be transferred to an output device such as a monitor 18 for display. Rather than the typical electro-mechanical hard disk drive which is typically used for long term memory, a flash EEPROM memory array may be used as the long term memory 16. Such flash EEPROM memory arrays are programmed and erased through techniques which utilize voltages greater than those typically available to the integrated circuits of more advanced portable computers. Such flash EEPROM memory arrays may include circuitry for programming and erasing the memory array. Consequently, in accordance with the present invention, such long term memory arrays may provide circuitry for generating high voltages from the lower voltages available from the batteries available in the portable computers in which such arrays are typically found.

A flash EEPROM memory array is made up of memory cells which include floating gate field effect transistor devices. Such memory transistors may be programmed to change the charge stored on the floating gate, and the condition (programmed or erased) may be detected by interrogating the cells. The conventional method of erasing an array of flash EEPROM memory cells erases all of the cells together (or at least some large block thereof). Typically, this requires the application of twelve volts to the source terminals of all of the memory cells, grounding the gate terminals, and floating the drain terminals. This conventional form of erasing flash EEPROM memory arrays is referred to as positive source erase. This positive source erase has been felt to require an inordinate amount of current because of the diode action between the source and substrate of a N type flash EEPROM memory cell. For this reason, designers have been attempting to provide negative gate erase techniques to obviate the loss of current through the diode effect. In this manner, charge pumps may provide sufficient current to generate the power for effectively erasing and programming flash EEPROM memory.

In accordance with the newer negative erase technique, a large negative voltage (typically minus nine or ten volts) is provided at the gate terminal of the memory device; and Vcc (typically five volts) is provided at the source terminal. The five volts at the source terminal is not sufficient to break down the source-substrate junction diode of the device, and only a relatively insubstantial amount of source current flows. Consequently, though similar voltage differentials are applied between the gate and source terminals of the device, the negative erase technique requires much less current from the charge pump.

Figure 2:
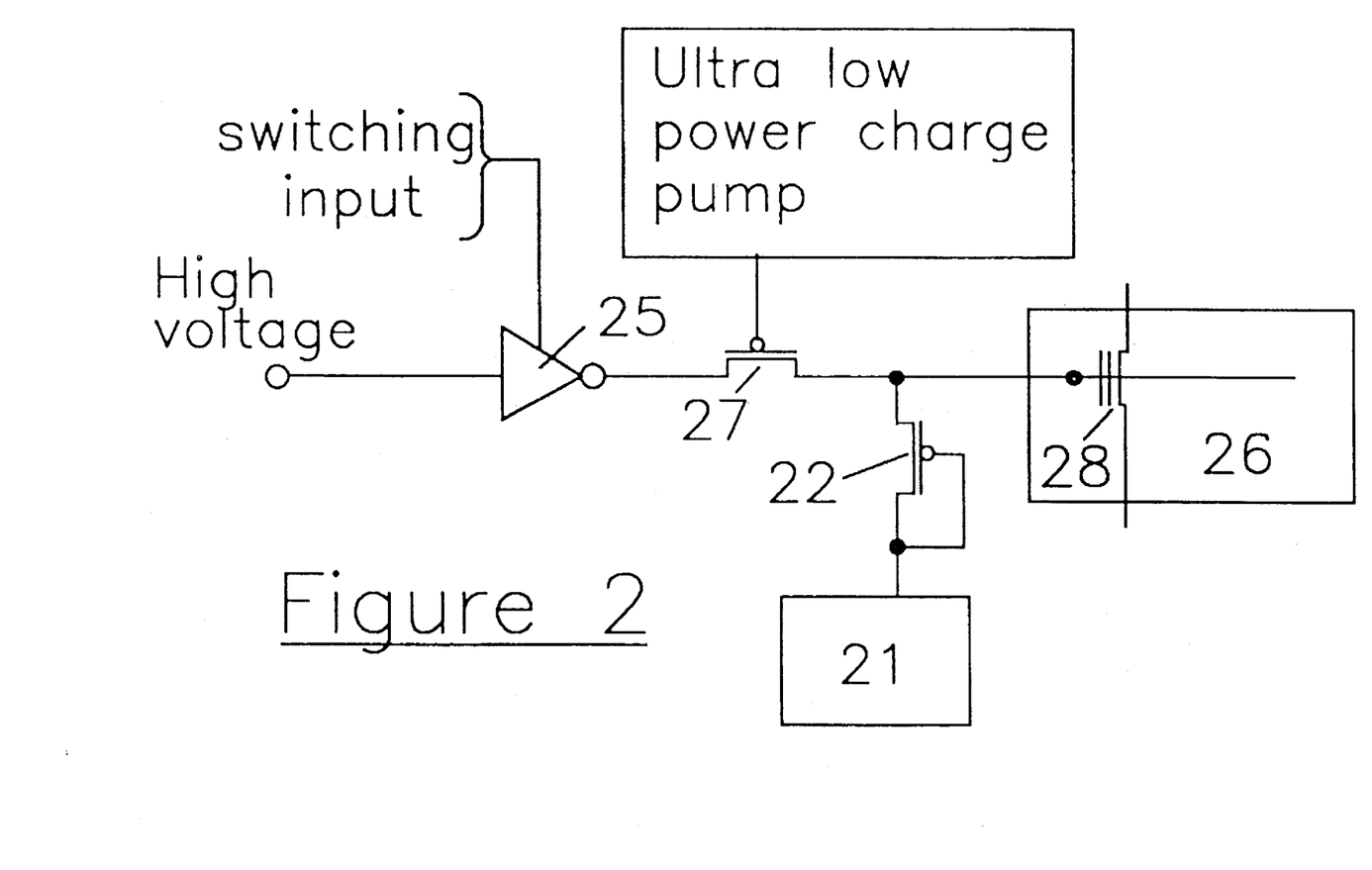
FIG. 2 is a block diagram illustrating the use of a negative charge pump circuit in accordance with the present invention for controlling a wordline isolation transistor for a flash EEPROM memory array.

In order to utilize the negative erase technique with a flash EEPROM memory array, it is necessary to apply a precise negative voltage to the gate terminal of a P channel isolation transistor in order to isolate the decoding circuitry from the memory array. FIG. 2 is a block diagram of a flash EEPROM memory array with associated circuitry related to wordline access. FIG. 2 shows an array 26 of flash EEPROM memory devices 28. A single row decode circuit is illustrated for use with the array 26. The circuit includes an inverter 25 which joins a particular row of the array 26 to the decode circuitry. The inverter 25 is used for applying a high voltage (such as twelve volts) utilized for programming the memory cells of the array 26 and for applying five volts to the gate terminals of the memory transistors during a read operation. The inverter 25 is joined to the wordline by an isolation transistor 27. The transistor 27 is a P type FET device which reacts to a negative voltage at its gate terminal to connect the high voltage to the wordline. The isolation transistor 27 is used in order to isolate the negative erase potential so that N+ junctions of N type transistors are not forward biased in the word decoder. A negative charge pump circuit 21 is also connected to the wordline by a P type FET device 22. The negative charge pump circuit 21 is used to provide a negative voltage at the wordline and the gate terminals of the flash EEPROM memory cells of the array 26 for erasing those cells. As has been explained above, the negative voltage is applied to the gate terminals while a small positive voltage is applied to the source terminals of the memory cells to cause the erasure of conditions stored by the flash cells.

Figure 3:
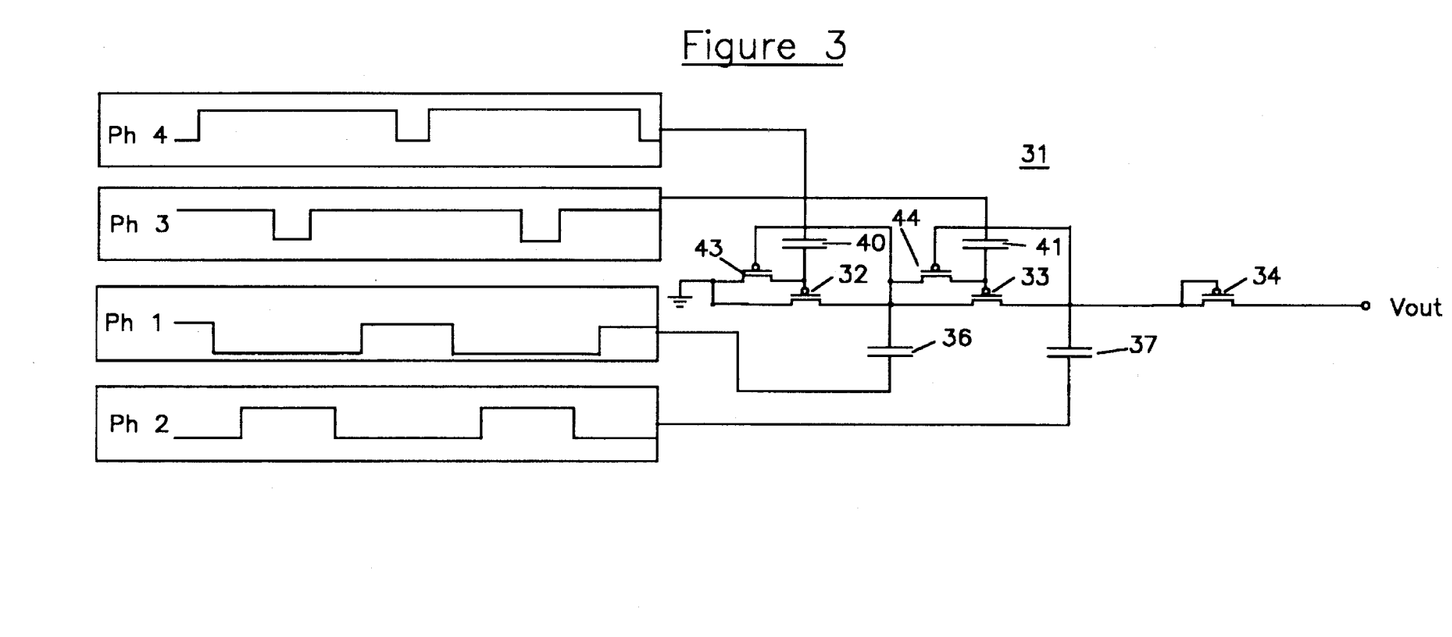
FIG. 3 is a block diagram of a negative charge pump circuit which illustrates its operation in the present invention.

The erasing of the memory device 28 requires that a positive five volts be applied to the source terminal of the device 28, that minus nine volts be applied to the gate terminal, and that the drain terminal be floated. The five volts at the source terminal is not sufficient to break down the source-substrate junction diode of the device, and only a relatively insubstantial amount of source current flows. Consequently, the negative gate erase technique requires much less current from the charge pump than does the positive erase technique. The operation of the transistor device 27 to select the programming voltage or isolate the negative erase voltage is controlled by a negative voltage provided by an ultra low power regulated negative charge pump in accordance with the present invention. It is desirable to regulate this pump in order to ensure that adequate voltage is available to turn on the isolation transistor 27 during programming and read. This voltage used should not be too large in order to avoid stressing the isolation transistor, In a portable computer, the negative voltages necessary to operate various portions of a flash EEPROM memory array, such as the voltage applied at the gate terminal of an isolation transistor, may be furnished by a charge pump. FIG. 3 illustrates a negative charge pump 31 which may be used to provide such a negative voltage. FIG. 3 illustrates a first bootstrap pump arrangement which may be utilized to provide a number of different levels of negative voltages including the high negative voltages required for erasing flash EEPROM memory arrays in accordance with the negative erase technique. As will be apparent to those skilled in the art, a similar charge pump with P channel transistors replaced by N channel transistors and having a positive voltage input may be utilized to provide the high positive voltages for accomplishing positive source erase operations and other operations such as programming requiring positive output voltages. As is shown in FIG. 3, the pump 31 includes a number of stages of P type field effect transistors (FETs) 32, 33, and 34 connected in series between ground and an output terminal Vout. Input clock signals are furnished to the circuit 31 from sources illustrated via capacitors 36 and 37. A second set of input clock signals are furnished from sources illustrated by capacitors 40 and 41. Each stage of the circuit 31 includes a P channel FET device 43 or 44 used to precharge the gate terminal of the device 32 or 33 of that stage. The first stage is comprised of the transistor devices 32 and 43 and the capacitors 36 and 40.

Four individual clock signals referred to as phase 1, phase 2, phase 3, and phase 4 are shown in FIG. 3. Each of these clock signals provides a high value of Vcc and a low value of ground. In order to understand the operation of the circuit 31, the operation of a single stage including the device 33 will be discussed. Following the timing diagram of FIG. 3, the phase 2 and phase 4 clocks are initially low. Since the phase 2 clock is low, the control device 44 is initially on. When the phase 1 clock signal goes low, the negative voltage pulse applied through the capacitor 36 charges the capacitor 41 at the gate terminal of the device 33 through the device 44 to the negative voltage level of the source terminal of the device 33. When the phase 2 clock then goes high, the device 44 turns off, isolating the gate of the device 33 and leaving the capacitor 41 charged to a negative level.

When the phase 3 clock then goes low, the voltage at the gate terminal of the device 33 is appreciably lower than the voltage at the source terminal because of the precharging of the capacitor 41 to a negative value. This turns the device 33 on in the region in which it experiences no threshold voltage (Vt) drop. The elimination of the Vt drop means that increased current is transferred more rapidly from the capacitor 36 to the next stage. The negative voltage phase 1 pulse at the capacitor 36 begins to charge the capacitor 37 (toward a value of minus Vcc).

When the phase 3 clock then goes high, the device 33 begins to go off. When the phase 2 clock goes low, the capacitor 37 goes to approximately minus twice Vcc; and the device 44 turns on discharging the gate of the device 33 and bringing it toward the voltage of the drain so that the device 33 turns off rapidly. When the phase 1 clock then goes high, the device 33 stays off and the device 44 stays on so that the charge at the drain and gate terminals of the device 33 are equalized.

Viewing the circuit as a whole, when the device 32 comes on in response to the negative edge of the phase 4 clock, the capacitor 40 at its gate terminal has been placed at ground through the device 43 which has gone off. Thus, the gate terminal of the device 32 is forced much lower than the source terminal and the device 32 comes on without a Vt drop and charges the capacitor 36 and the capacitor 41 to ground level very rapidly. Then the device 32 begins to turn off as the phase 4 clock goes high. The drop of the phase 1 pulse causes the capacitor 36 to go to minus Vcc and completes the turnoff of the device 32 by discharging the capacitor 40 through the device 43. The low value phase 1 clock continues the charging of the capacitor 41 until the rise of the phase 2 clock turns off the device 44 leaving the gate of the device 33 charged. As explained above, the device 33 comes on completely without a Vt drop when the phase 3 clock goes low and the gate terminal of the device 33 which is charged to a negative value goes below the source terminal. This allows the rapid charge of the capacitor 37 to a negative value of approximately minus two times Vcc. The same sequence would continue through whatever number of stages are present until the charge on the capacitor 37 is sufficient to turn on the device 34 to provide a pumped voltage level at the output of the circuit 31. It should be noted that the device 34 operates in a range in which it exhibits a Vt drop since no bootstrap transistor is provided.

This basic operation continues in the manner explained. The two stage pump circuit 31 illustrated in FIG. 3 furnishes a negative voltage of approximately N (where N is the number of stages) times the pumped voltage Vcc at the output terminal less the Vt drop of the device 44. More importantly, the circuit 31 provides a very efficient operation because the circuit 31 does not have the threshold voltage drops of the usual charge pump circuit except for the last stage. This allows it to provide more current at the output and to do it more rapidly. This increased efficiency allows the charge pump to be implemented in fewer stages and therefore requires less die area on an integrated circuit.

Figures 4, 5:
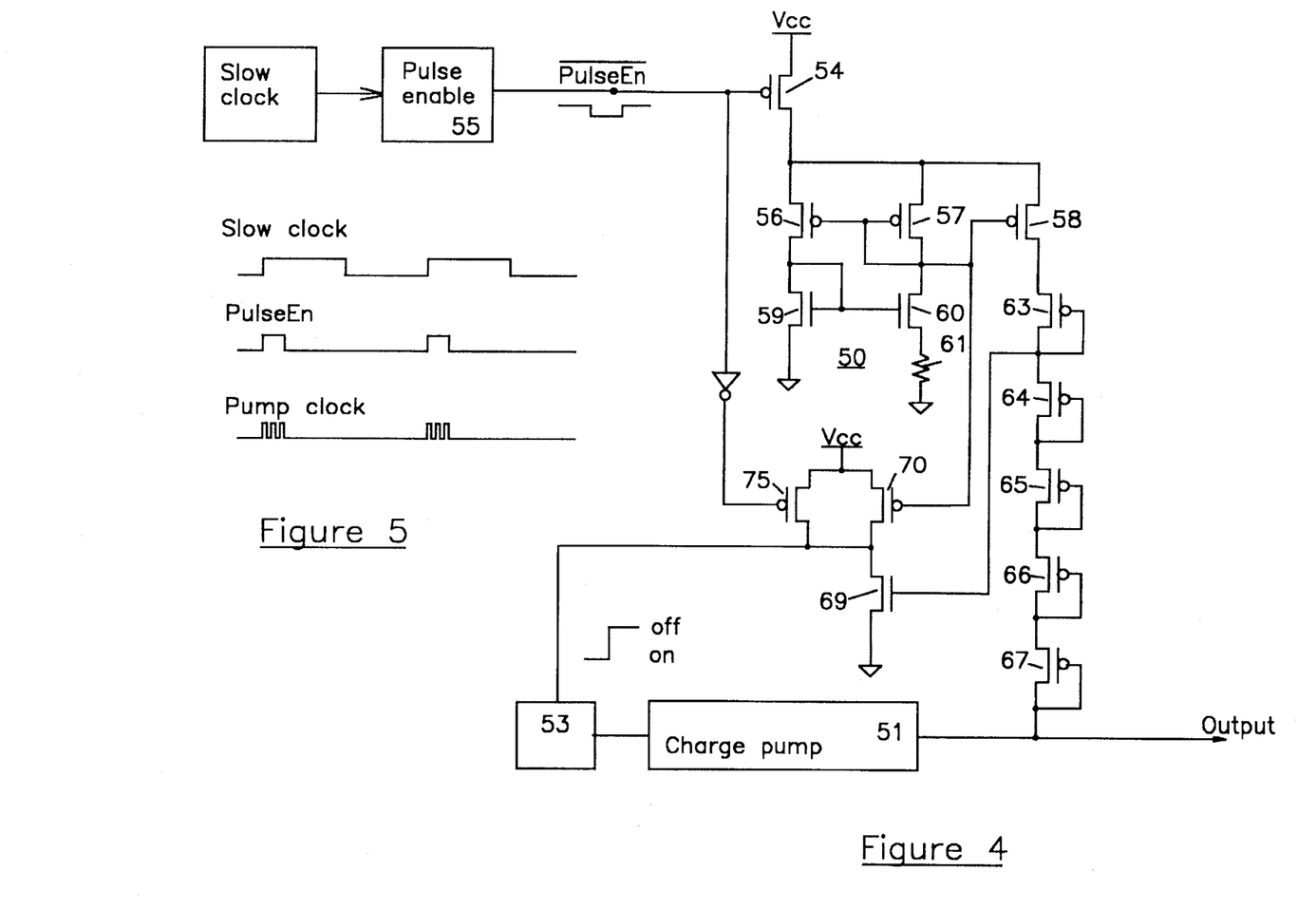
FIG. 4 is a block diagram of a circuit for providing the present invention
FIG. 5 is a timing diagram illustrating the values of different signals used in the circuit of FIG. 3.

Referring now to FIG. 4, there is illustrated a block diagram of a circuit 50 designed in accordance with the present invention. The circuit 50 includes a negative charge pump 51 which may be a charge pump such as that illustrated in FIG. 3. The charge pump 51 receives clock input signals in the manner described above and produces an output voltage value. The output voltage in the preferred embodiment is a negative voltage which may be applied to the gate terminals of the P channel isolation transistors in a flash EEPROM memory array designed to utilize negative erase techniques. The circuit 50 is specifically designed to provide the negative voltage used for application to the wordline of a flash EEPROM memory array for reading the values stored in the memory cells.

In order to both reduce the power utilized by the charge pump 51 and to regulate the voltage output which is produced, a unique biasing circuit is used. The circuit includes a P type field effect transistor (FET) device 54 which has its source terminal connected to a source voltage Vcc. The drain of the P type device 54 is joined to the source terminals of a number of essentially identical P type FET devices 56, 57, and 58. The gate terminals of each of the P type FET devices 56, 57, 58, and a similar P type FET device 70 are joined together. Since the gates of the devices 56, 57, 58, and 70 are connected and the source terminal of each device is connected to the source voltage Vcc, the current through the device 56 is mirrored through each of the other devices 57, 58, and 70. The current path through the device 56 continues to ground through the drain and source terminals of a N type FET device 59. The current path through the device 57 continues to ground through the drain and source terminals of a N type FET device 60 and a resistor 61. The current path through the device 58 continues to the output terminal of the pump 51 through a series path including a plurality of similar diode-connected P type FET devices 63–67 which together function as a divider circuit.

The transistors 56 and 57 form a first current mirror. The transistors 59 and 60 also form a current mirror with a gain greater than one. Since the devices 56 and 57 are matched, they carry equal currents in an arrangement which is power supply independent. The current provided by this arrangement is mirrored from the device 57 to the current mirror arrangement including the transistor 58 and to the current mirror arrangement including the transistor 70.

A N type FET device 69 and the P type FET device 70 have their source and drain terminals connected in series between the source voltage Vcc and ground. These devices provide a comparator arrangement which controls whether a circuit 53 which provides clock pulses for operating the pump 51 is enabled or disabled. The gate terminal of the N type device 69 is connected between devices 63 and 64 in the divider network. Since the P type device 70 is connected to mirror the current through the devices 56 and 57, it acts as a current source for the comparator arrangement which provides input to the circuit 53.

The devices 56, 57, 58, 59, 60, and 70 are biased to provide a very small current, and they normally conduct when the source voltage Vcc is applied through a conducting device 54. The device 54 is enabled by a low valued voltage applied at its gate terminal. This low valued voltage is supplied from a source of pulse enable signals 55 for a period selected to be short with respect to the overall period of a first slow clock signal. During the period of the pulse enable signal, current flows through the devices 56 and 59 to ground. This current is mirrored through the device 57 and through the device 58. The small bias current through the device 58 is sufficient to sustain current through the devices 63–67 of the divider network so that a threshold voltage drops across each device of the divider. When the output voltage of the pump 51 is at its desired negative level, the voltage provided at the gate terminal of the device 69 is lower than a threshold voltage.

Since the current through the device 56 is ultimately mirrored through the device 70, the device is enabled when the device 54 is enabled. If the voltage at the output of the charge pump 51 is above (more positive than) the desired negative output level, the N type device 69 is on and transfers this current to ground providing an input signal of a first low level to the pump clock circuit 53. This low valued input signal at the pump clock circuit 53 enables the clock signals necessary to operate the charge pump 51 to provide a negative output voltage for the isolation transistors of the memory array. Otherwise, the charge pump 51 is disabled.

In order to assure that the output voltage produced by the charge pump 51 is of a relatively constant value, the bias current through the device 57 is mirrored into the devices 58 and 70. Since the device 70 acts as a current source for the comparator, the device 70 will attempt to transfer the same current as the device 57. At the same time, the voltage at the gate terminal of the device 69 varies with the value provided at the output terminal. If the voltage at the output terminal is higher than desired (not sufficiently negative), the device 69 is on and a relatively low voltage is applied to the pump clock generator 53 to enable the charge pump 51. When the voltage at the output terminal is more negative than the desired output value, the device 69 switches off and a high voltage value (Vcc) is applied to the pump clock generator 53 from the source Vcc to disable the clock. When this occurs, the voltage level at the output of the charge pump 51 is held relatively constant over some period by the output load circuitry. The voltage level at the output will gradually rise as charge on the capacitive output load dissipates over a period approximating the remaining length of the slow clock. Thus, the biasing arrangement operates to regulate the output voltage of the pump 51 by selectively enabling the device 69 during the state in which a pump enable pulse is furnished to the device 54.

When the pulse enable signal ends and the device 54 is disabled, the bias circuit is turned off and the device 70 is disabled. However, the high valued pump enable signal is then inverted and furnished to a P type FET device 75. The device 75 is enabled to apply the source voltage Vcc to the pump clock circuit 53 and disable the pump 51. This shuts the pump 51 off entirely. Since the pump 51 runs only during the short time of the pulse enable signal, the actual power utilized by the pump 51 is very small compared to what would be furnished were the pump to run at all times. In this manner, a very low power regulated charge pump circuit is furnished.

It should be noted that not only does the circuit 50 reduce the power requirements of the charge pump 51 because it runs for a very short period, it also reduces the power requirements because unlike most regulation circuits, it does not require the generation of a voltage reference which must be constantly furnishing power. For this reason, the circuit uses a very small amount of power compared to circuits of the prior art.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for providing a regulated output voltage from a charge pump circuit while utilizing very low amounts of power, the circuit comprising:
   a charge pump circuit,
   a clock circuit for providing clock pulses to operate the charge pump circuit to produce an output voltage,
   a bias circuit for regulating the output voltage by monitoring the output voltage of the charge pump and enabling the clock circuit when insufficient output voltage is detected, and
   circuitry for enabling the bias circuit during a fraction of the total operating time available to the charge pump.

2. A circuit for providing a regulated output voltage from a charge pump circuit while utilizing very low amounts of power as claimed in claim 1 in which the output voltage produced by the charge pump is negative.

3. A circuit for providing a regulated output voltage from a charge pump circuit while utilizing very low amounts of power as claimed in claim 1 in which the bias circuit comprises:

a voltage divider arranged between an output terminal of the charge pump and a source of potential, and a comparator circuit connected to function in response to a voltage produced by the voltage divider.

4. A circuit for providing a regulated output voltage from a charge pump circuit while utilizing very low amounts of power as claimed in claim 3 in which the voltage divider comprises a plurality of diode-connected transistors devices.

5. A circuit for providing a regulated output voltage from a charge pump circuit while utilizing very low amounts of power as claimed in claim 1 in which the circuitry for enabling the bias circuit during a fraction of the total operating time available to the charge pump comprises:

a transistor switch connected to a source of potential, a source of enabling pulses for the transistor switch, a circuit for generating a first current in response to the source of potential provided by the transistor switch, and current-mirror circuitry for furnishing a current mirroring the first current to the bias circuit.

6. A computer system comprising:

central processor;

main memory;

a system bus associated with the central processor and main memory; and a flash EEPROM memory array including a plurality of memory cells arranged in rows and columns, wordline circuitry for accessing the memory cells of a row of the flash EEPROM memory array for reading and writing including an isolation transistor, and a circuit for providing a regulated negative output voltage from a charge pump circuit while utilizing very low amounts of power for controlling the operation of the isolation transistor, the circuit comprising a charge pump circuit, a clock circuit for providing clock pulses to operate the charge pump circuit to produce an output voltage, a bias circuit for regulating the output voltage by monitoring the output voltage of the charge pump and enabling the clock circuit when insufficient output voltage is detected, and circuitry for enabling the bias circuit during a fraction of the total operating time available to the charge pump.

7. A computer system as claimed in claim 6 in which the bias circuit comprises:

a voltage divider arranged between an output terminal of the charge pump and a source of potential, and a comparator circuit connected to function in response to a voltage produced by the voltage divider.

8. A computer system as claimed in claim 7 in which the voltage divider comprises a plurality of diode-connected transistor devices.

9. A computer system as claimed in claim 6 in which the circuitry for enabling the bias circuit during a fraction of the total operating time available to the charge pump comprises:

a transistor switch connected to a source of potential, a source of enabling pulses for the transistor switch, a circuit for generating first current in response to the source of potential provided by the transistor switch, and current-mirror circuitry for furnishing a current mirroring the first current to the bias circuit.

10. A circuit for providing a regulated output voltage from charge pump means while utilizing very low amounts of power, the circuit comprising:

charge pump means, means for providing clock pulses to operate the charge pump means to produce an output voltage, means for regulating the output voltage by monitoring the output voltage of the charge pump means and enabling the clock circuit when insufficient output voltage is detected, and means for enabling the means for monitoring the output voltage of the charge pump means during a fraction of the total operating time available to the charge pump means.

11. A circuit for providing a regulated output voltage from charge pump means while utilizing very low amounts of power as claimed in claim 10 in which the output voltage produced by the charge pump means is negative.

12. A circuit for providing a regulated output voltage from charge pump means while utilizing very low amounts of power as claimed in claim 10 in which the means for monitoring the output voltage of the charge pump means comprises voltage divider means arranged between an output terminal of the charge pump means and a source of potential, and means functioning to compare a voltage produced by the voltage divider means with a desired voltage.

13. A circuit for providing a regulated output voltage from charge pump means while utilizing very low amounts of power as claimed in claim 12 in which the voltage divider means comprises a plurality of diode-connected transistors devices.

14. A circuit for providing a regulated output voltage from charge pump means while utilizing very low amounts of power as claimed in claim 10 in which the means for enabling the means for monitoring the output voltage of the charge pump means during a fraction of the total operating time available to the charge pump means comprises:

switching means for providing a voltage from a source of potential, means for enabling the switching means, means for generating a first current in response to the voltage from the source of potential provided by the switching means, and means for furnishing a current mirroring the first current to the means for monitoring the output voltage of the charge pump means.

15. A computer system comprising:

processor means;

main memory means;

busing means associated with the processor means and main memory means; and flash EEPROM memory array means including a plurality of memory cells arranged in rows and columns, means for accessing the memory cells of a row of the flash EEPROM memory array for reading and writing including transistor isolation means, and means for providing a regulated negative output voltage from charge pump means while utilizing very low amounts of power for controlling the operation of the transistor isolation means, the last mentioned means comprising charge pump means, means for providing clock pulses to operate the charge pump means to produce an output voltage, means for regulating the output voltage by monitoring the output voltage of the charge pump means and enabling the clock circuit when insufficient output voltage is detected, and means for enabling the means for monitoring the output voltage of the charge pump means during a fraction of the total operating time available to the charge pump means.

16. A computer system as claimed in claim 15 in which the means for monitoring the output voltage of the charge pump means comprises voltage divider means arranged between an output terminal of the charge pump means and a source of potential, and means functioning to compare a voltage produced by the voltage divider means with a desired voltage.

17. A computer system as claimed in claim 16 in which the voltage divider means comprises a plurality of diode-connected transistors devices.

18. A computer system as claimed in claim 16 in which the means for enabling the means for monitoring the output voltage of the charge pump means during a fraction of the total operating time available to the charge pump means comprises:

switching means for providing a voltage from a source of potential, means for enabling the switching means, means for generating a first current in response to the voltage from the source of potential provided by the switching means, and means for furnishing a current mirroring the first current to the means for monitoring the output voltage of the charge pump means.

19. A method for providing a regulated voltage while using a small amount of power comprising the steps of:

measuring an output voltage during a preselected fraction of a period during which the voltage is provided, comparing the voltage to a sufficient output voltage, generating clock pulses in response to a voltage less than a sufficient voltage, and operating a charge pump to produce an output voltage to be measured in response to clock pulses produced.

* * * * *

UNITED STATES PATENT AND TRADEMARK OFFICE
CERTIFICATE OF CORRECTION

PATENT NO. : 5,532,915
DATED : July 2, 1996
INVENTOR(S) : Pantelakis et al.

It is certified that error appears in the above-indentified patent and that said Letters Patent is hereby corrected as shown below:

In column 2 at line 9 delete "art" and insert --an--

In column 9 at line 24 insert "a" prior to "central"

In column 9 at line 25 insert "a" prior to "main"

Signed and Sealed this

Twenty-fourth Day of December, 1996

Attest:

BRUCE LEHMAN

*Attesting Officer*     *Commissioner of Patents and Trademarks*